United States Patent
Sakashita et al.

(10) Patent No.: US 7,319,081 B2
(45) Date of Patent: Jan. 15, 2008

(54) THIN FILM CAPACITY ELEMENT COMPOSITION, HIGH-PERMITTIVITY INSULATION FILM, THIN FILM CAPACITY ELEMENT, THIN FILM MULTILAYER CAPACITOR, ELECTRONIC CIRCUIT AND ELECTRONIC APPARATUS

(75) Inventors: Yukio Sakashita, Chuo-ku (JP); Hiroshi Funakubo, Kawasaki (JP)

(73) Assignee: TDK Corporation, Tokyo (JP)

( * ) Notice: Subject to any disclaimer, the term of this patent is extended or adjusted under 35 U.S.C. 154(b) by 150 days.

(21) Appl. No.: 10/547,134

(22) PCT Filed: Nov. 18, 2003

(86) PCT No.: PCT/JP03/14651

§ 371 (c)(1),
(2), (4) Date: Aug. 26, 2005

(87) PCT Pub. No.: WO2004/077460

PCT Pub. Date: Sep. 10, 2004

(65) Prior Publication Data

US 2006/0098385 A1    May 11, 2006

(30) Foreign Application Priority Data

Feb. 27, 2003 (JP) ............................. 2003-051897

(51) Int. Cl.
*C04B 35/475* (2006.01)
*H01L 29/76* (2006.01)

(52) U.S. Cl. ............ 501/134; 501/135; 501/136; 252/62.9 R; 257/295; 257/310

(58) Field of Classification Search ............... 501/134, 501/135, 136; 257/310, 295; 252/62.9 R
See application file for complete search history.

(56) References Cited

U.S. PATENT DOCUMENTS

2004/0245561 A1* 12/2004 Sakashita et al. ............ 257/310
2006/0126267 A1*  6/2006 Sakashita et al. ........ 361/306.3
2006/0186395 A1*  8/2006 Sakashita ........................ 257/9
2006/0237760 A1* 10/2006 Sakashita ..................... 257/303

(Continued)

FOREIGN PATENT DOCUMENTS

JP    A 56-144523    11/1981

(Continued)

OTHER PUBLICATIONS

Kojima et al.; "Novel Candidate of c-axis-oriented BLSF Thin Films for High-Capacitance Condenser"; Mat. Res. Soc. Symp. Proc.; vol. 748; 2003; pp. 451-456.

(Continued)

*Primary Examiner*—Karl E Group
(74) *Attorney, Agent, or Firm*—Oliff & Berridge, PLC

(57) ABSTRACT

A thin film capacity element composition includes a first bismuth layer-structured compound having positive temperature characteristics, that a specific permittivity rises as the temperature rises, in at least a part of a predetermined temperature range and a second bismuth layer-structured compound having negative temperature characteristics, that a specific permittivity declines as a temperature rises, in at least a part of said predetermined temperature range at any mixing ratio; wherein the bismuth layer-structured compound is expressed by a composition formula of $Ca_xSr_{(1-x)}Bi_4Ti_4O_{15}$.

16 Claims, 5 Drawing Sheets

U.S. PATENT DOCUMENTS

2006/0249811 A1* 11/2006 Sakashita .................... 257/532

FOREIGN PATENT DOCUMENTS

| JP | A 64-086510 | 3/1989 |
|---|---|---|
| JP | A 05-335173 | 12/1993 |
| JP | A 05-335174 | 12/1993 |
| JP | A 08-249876 | 9/1996 |
| JP | 09-293629 | 11/1997 |
| JP | 10-144867 | 5/1998 |
| JP | A 10-265261 | 10/1998 |
| JP | 10-297967 | 11/1998 |
| JP | 11-163273 | 6/1999 |
| JP | A 11-214245 | 8/1999 |
| JP | A 2000-124056 | 4/2000 |
| JP | A 2000-169297 | 6/2000 |
| JP | 2000-223352 | 8/2000 |
| JP | 2000-252152 | 9/2000 |
| JP | 2000-260655 | 9/2000 |
| JP | A 2000-281434 | 10/2000 |
| JP | A 2001-338834 | 12/2001 |
| JP | 2003-347151 | 12/2003 |

OTHER PUBLICATIONS

Kojima et al.; "Capacitor Applications of c-Axis Oriented Bismuth Layer Structured Ferroelectric Thin Films"; The 27th Annual Cocoa Beach Conference & Exposition on Advanced Ceramics & Composites; Jan. 26-31, 2003.

The 5th International Meeting of Pacific Rim Ceramic Societies Incorporating the 16th Fall Meeting of the Ceramic Society Of Japan; Abstract Book; Sep. 29-Oct. 2, 2003; p. 111.

The 5th International Meeting of Pacific Rim Ceramic Societies Incorporating the 16th Fall Meeting of the Ceramic Society Of Japan; Abstract Book; Sep. 29-Oct. 2, 2003; p. 35.

MRS2002 Program Exhibit Guide; Fall Meeting; Dec. 2-6, 2002; Boston, MA; p. 211.

Extended Abstracts; The 50th Spring Meeting, 2003; The Japan Society of Applied Physics and Related Societies; No. 2; Mar. 2003; p. 596.

Extended Abstracts; The 64th Autumn Meeting, 2003; The Japan Society of Applied Physics; No. 2; Aug. 2003; p. 493.

* cited by examiner

THIN FILM CAPACITY ELEMENT COMPOSITION, HIGH-PERMITTIVITY INSULATION FILM, THIN FILM CAPACITY ELEMENT, THIN FILM MULTILAYER CAPACITOR, ELECTRONIC CIRCUIT AND ELECTRONIC APPARATUS

TECHNICAL FIELD

The present invention relates to a thin film capacity element composition, a high-permittivity insulation film, a thin film capacity element, a thin film multilayer capacitor, an electronic circuit and an electronic-apparatus.

BACKGROUND ART

As a dielectric composition used for a multilayer ceramic capacitor bulk shaped capacitor materials, such as lanthanum titanate ($La_2O_3 \cdot 2TiO_2$), zinc titanate ($ZnO \cdot TiO_2$), magnesium titanate ($MgTiO_3$), titanium oxide ($TiO_2$), bismuth titanate ($Bi_2O_3 \cdot 2TiO_2$), calcium titanate ($CaTiO_3$) and strontium titanate ($SrTiO_3$), are known. Capacitor materials of this kind have a small temperature coefficient, so that they can be preferably used for a coupling circuit, audio circuit and an image processing circuit, etc.

However, capacitor materials of this kind have a tendency that the permittivity becomes low (for example, less than 40) when the temperature coefficient becomes small (for example, within ±100 ppm/° C.), while when the permittivity becomes high (for example 90 or higher), the temperature coefficient also becomes large (for example, ±750 ppm/° C. or larger). For example, temperature coefficients (the reference temperature is 25° C., the unit is ppm/° C.) of $La_2O_3 \cdot 2TiO_2$, $ZnO \cdot TiO_2$, $MgTiO_3$ are small as +60, −60 and +100, respectively, and along therewith, the permittivity (a measurement frequency is 1 MHz, no unit) becomes small as 35 to 38, 35 to 38 and 16 to 18, respectively. On the other hand, for example, permittivity of $TiO_2$, $Bi_2O_3 \cdot 2TiO_2$, $CaTiO_3$ and $SrTiO_3$ is high as 90 to 110, 104 to 110, 150 to 160 and 240 to 260, respectively, and along therewith, their temperature coefficients become large as −750, −1500, −1500 and −3300, respectively. Accordingly, development of a temperature compensating capacitor material, which can maintain a relatively high permittivity even when the temperature coefficient is small, is desired.

In recent years, in the field of electronic devices, there have been demands for a furthermore compact capacitor element as an essential circuit element in a variety of electronic circuits along with electronic circuits becoming higher in density and more highly integrated.

For example, a thin film capacitor using a single-layer dielectric thin film is behind in making a compact integrated circuit with a transistor or other active element, which has been a factor of hindering realization of an ultra-high integrated circuit. It was a low permittivity of a dielectric material to be used that has hindered attaining of a compact thin film capacitor. Accordingly, it is significant to use a dielectric material having a high permittivity to realize a more compact thin film capacitor with a relatively high capacity.

Also, in recent years, a conventional multilayer film of $SiO_2$ and $Si_3N_4$ has become hard to respond to a capacitor material for a DRAM of the next generation (gigabit generation) in terms of capacity density, and a material system having a higher permittivity has gathered attention. In such a material system, an application of TaOx ($\epsilon$=30 or smaller) has been mainly studied but development of other materials has come to be actively pursued.

As a dielectric material having a relatively high permittivity, (Ba, Sr)$TiO_3$ (BST) and Pb($Mg_{1/3}$ $Nb_{2/3}$)$O_3$ (PMN) are known.

It can be considered that it is possible to attain a compact body when composing a thin film capacity element by using a dielectric material of this kind.

However, a dielectric material of this kind was not a temperature compensating material and the temperature coefficient was large (for example, exceeding 4000 ppm/° C. in BST), so that when configuring a thin film capacitor element by using such a material, temperature characteristics of the permittivity was deteriorated in some cases. Also, when using dielectric materials of this kind, the permittivity declined as the dielectric film became thinner in some cases. Furthermore, a leakage property and a breakdown voltage were also deteriorated due to apertures generated on the dielectric film as the film became thinner in some cases. Furthermore, it was liable that the dielectric film to be formed had poor surface smoothness. Note that due to a large effect by lead compounds, such as PMN, on the environment, a high capacity capacitor not containing lead has been desired in recent years.

On the other hand, to realize a more compact multilayer ceramic capacitor with a larger capacity, it is desired that a thickness of one dielectric layer is made as thin as possible (a thinner layer) and the number of dielectric layers at a predetermined size is increased as much as possible (an increase of stacked layers).

However, for example, when producing a multilayer ceramic capacitor by a sheet method (a method of forming a dielectric green sheet layer on a carrier film by using a dielectric layer paste by the doctor blade method, etc., printing an internal electrode layer paste to be a predetermined pattern thereon, then, releasing them one by one and stacking the same), the dielectric layer could not be made thinner than ceramic material powder. Furthermore, it was difficult to make the dielectric layer thin, for example, as 2 μm or thinner because of problems of short-circuiting and breaking of internal electrode, etc. due to a defective dielectric layer. Also, when a thickness of one dielectric layer was made thinner, the number of stacked layers was also limited. Note that the same problem remained in the case of producing a multilayer ceramic capacitor by the printing method (a method of alternately printing a dielectric layer paste and an internal electrode layer paste for a plurality of times on a carrier film, for example, by using the screen printing method, then, removing the carrier film).

Due to the above reasons, there was a limit in making the multilayer ceramic capacitor more compact and higher in capacity.

Thus, a variety of proposals have been made to solve the problem (for example, the patent article 1: the Japanese Patent Publication No. 56-144523, the patent article 2: the Japanese Patent Publication No. 5-335173, the patent article 3: the Japanese Patent Publication No. 5-335174, the patent article 4: the Japanese Patent Publication No. 11-214245 and the patent article 5: the Japanese Patent Publication No. 2000-124056, etc.). These publications disclose methods of producing a multilayer ceramic capacitor formed by alternately stacking dielectric thin films and electrode thin films by using a variety of thin film forming methods, such as the CVD method, evaporation method and sputtering method.

However, in the techniques described in these patent articles, there is no description on composing a dielectric thin film by using a dielectric material having a small temperature coefficient and capable of maintaining a relatively high permittivity, and a temperature compensating thin film multilayer capacitor is not disclosed.

Also, a dielectric thin film formed by the methods described in the patent articles had poor surface smoothness, and short-circuiting of electrodes arose when stacking too much, so that those having 12 or 13 stacked layers or so were able to be produced at most. Therefore, even when the capacitor could be made compact, a higher capacity could not be attained without deteriorating temperature characteristics of permittivity.

Note that as described in the non-patent article 1 ["Particle Orientation for Bismuth Layer-Structured Ferroelectric Ceramic and Application to its Piezoelectric and Pyroelectric Material" by Tadashi Takenaka, pp. 23 to 77 in chapter 3 of Kyoto University Doctor of Engineering Thesis (1984)], it is known that a bulk bismuth layer-structured compound dielectric obtained by the sintering method is composed of a composition expressed by a composition formula of $(Bi_2O_2)^{2+}(A_{m-1} B_m O_{3m+1})^{2-}$ or $Bi_2A_{m-1} B_m O_{3m+3}$, wherein "m" is a positive number from 1 to 8, "A" is at least one element selected from Na, K, Pb, Ba, Sr, Ca and Bi, and "B" is at least one element selected from Fe, Co, Cr, Ga, Ti, Nb, Ta, Sb, V, Mo and W.

However, in this article, nothing was disclosed on under what condition (for example, a relationship of a substrate surface and a c-axis orientation degree of a compound) when making the composition expressed by the above composition formula thinner (for example 1 µm or thinner), a thin film having excellent temperature characteristics of permittivity, capable of giving a relatively high permittivity and a low loss, having an excellent leakage property, improved breakdown voltage, and excellent surface smoothness even when made to be thin could be obtained.

Also, as disclosed in the patent article 6 (PCT/JP02/08574), the present inventors have developed "a thin film capacity element composition containing a bismuth layer-structured compound having a c-axis oriented vertically with respect to a substrate surface, wherein:

the bismuth layer-structured compound is expressed by a composition formula of $(Bi_2O_2)^{2+}(A_{m-1} B_m O_{3+1})^{2-}$ or $Bi_2A_{m-1} B_m O_{3m+3}$, wherein "m" is an even number, "A" is at least one element selected from Na, K, Pb, Ba, Sr, Ca and Bi, and "B" is at least one element selected from Fe, Co, Cr, Ga, Ti, Nb, Ta, Sb, V, Mo and W" and filed before.

The present inventors furthermore pursued experiments and found that a thin film capacity element composition composed of a bismuth layer-structured compound having a specific composition included in claims of the patent article 6 but not described in an embodiment of the specification had particularly excellent temperature characteristics of capacitance and that it was possible to control the temperature characteristics, and completed the present invention.

DISCLOSURE OF THE INVENTION

An object of the present invention is to provide a thin film capacity element composition having excellent temperature characteristics of permittivity, capable of giving a relatively high permittivity and a low loss, having an excellent leakage property, improved breakdown voltage, and excellent surface smoothness even when made to be thin and a thin film capacity element using the same. Also, another object of the present invention is to provide a compact thin film multilayer capacitor using the thin film capacitor element composition as above as a dielectric thin film, having excellent temperature characteristics of permittivity and capable of giving a relatively high capacity. Furthermore, still another object of the present invention is to provide a high-permittivity insulation film having excellent temperature characteristics of permittivity, capable of giving a relatively high permittivity and a low loss, and having an excellent leakage property, improved breakdown voltage and excellent surface smoothness. Furthermore, another object of the present invention is to provide an electronic circuit and electronic apparatus having excellent moisture compensating property by freely controlling a temperature coefficient of permittivity in a dielectric thin film, etc. by controlling a composition of the composition of the present invention.

The present inventors have been committed themselves to study a material and crystal structure of a dielectric thin film to be used for a capacitor, found that by using a bismuth layer-structured compound having a specific composition and making a c-axis ([001] orientation) of the bismuth layer-structured compound vertical with respect to the substrate surface when composing the dielectric thin film as a thin film capacitor element composition, that is, by forming a c-axis orientation film (a thin film normal line is in parallel with the c-axis) of the bismuth layer-structured compound on the substrate surface, it was possible to provide a thin film capacity element compound having excellent temperature characteristics of the permittivity, a relatively high permittivity and a low loss (tan δ is low), an excellent leakage property, improved breakdown voltage and excellent surface smoothness even when made to be thin; and a thin film capacity element using the same.

Also, it was found that by using such a thin film capacity element composition as a dielectric thin film, the number of stacked layers could be increased and a compact thin film multilayer capacitor having excellent temperature characteristics of permittivity and capable of giving a relatively high capacity could be provided, and the present invention was completed. Furthermore, it was found that by using such a composition as a high-permittivity insulation film, application to other use objects than a thin film capacity element became also possible.

Furthermore, it was found that an electronic circuit and an electronic apparatus having an excellent moisture compensating characteristic could be provided by freely controlling the temperature coefficient of permittivity in a dielectric thin film, etc. by controlling a composition of the composition of the present invention, and the present invention was completed.

Namely, a thin film capacity element composition according to the present invention includes a first bismuth layer-structured compound having positive temperature characteristics, that a specific permittivity rises as a temperature rises, in at least a part of a predetermined temperature range; and a second bismuth layer-structured compound having negative temperature characteristics, that a specific permittivity declines as a temperature rises, in at least a part of the predetermined temperature range;

at any mixing ratio.

In the present invention, at least three forms described below can be considered as a thin film capacity element composition comprising the first bismuth layer-structured compound and the second bismuth layer-structured compound at any mixing ratio.

(1) A thin film capacity element composition, wherein the first bismuth layer-structured compound and the second bismuth layer-structured compound exist in a completely solid solution form, (2) a thin film capacity element composition, wherein the first bismuth layer-structured compound and the second bismuth layer-structured compound exist not in a completely solid solution form but particles thereof are mixed, and (3) a thin film capacity element composition, wherein the first bismuth layer-structured compound layer and the second bismuth layer-structured compound layer exist by being stacked to sandwich a $(Bi_2O_2)^{2+}$ layer inside the crystal structure composing the bismuth layer-structured compound, are considered.

In any of the forms, an effect of the present invention is obtained.

Preferably, the first and second bismuth layer-structured compounds are expressed by a composition formula of $(Bi_2O_2)^{2+}(A_{m-1}B_mO_{3m+1})^{2-}$ or $Bi_2A_{m-1}B_mO_{3m+3}$, wherein "m" is a positive number, "A" is at least one element selected from Na, K, Pb, Ba, Sr, Ca and Bi, and "B" is at least one element selected from Fe, Co, Cr, Ga, Ti, Nb, Ta, Sb, V, Mo, W and Mn.

Preferably, a composition formula of the second bismuth layer-structured compound is expressed by $SrBi_4Ti_4O_{15}$ or $SrBi_2Ta_2O_9$.

Preferably, the first bismuth layer-structured compound is expressed by a composition formula of x $(MBi_4Ti_4O_{15})$, the second bismuth layer-structured compound is expressed by a composition formula of (1-x) $SrBi_4Ti_4O_{15}$, "M" in the composition formula is at least one of Ca, Ba and Pb, and "x" indicating a mixing ratio of the first bismuth layer-structured compound with respect to the entire composition satisfies $0 \leq x \leq 1$.

Preferably, a compound of the first bismuth layer-structured compound and second bismuth layer-structured compound is expressed by a composition formula of $Ca_xSr_{(1-x)}Bi_4Ti_4O_{15}$, wherein "x" satisfies $0 \leq x \leq 1$.

The thin film capacity element composition of the present invention may furthermore include a rare earth element (at least one element selected from Sc, Y, La, Ce, Pr, Nd, Pm, Sm, Eu, Gd, Tb, Dy, Ho, Er, Tm, Yb and Lu). Also by including a rare earth element, control of temperature characteristics of capacitance to a certain extent becomes possible and temperature characteristics of capacitance can be furthermore improved.

In the present invention, a thin film capacity element composition including the first layer-structured compound and the second layer-structured compound by any composition ratio is not necessarily c-axis oriented. In that case, by including the rare earth element, temperature characteristics of capacitance can be controlled to a certain extent, and temperature characteristics of capacitance can be furthermore improved.

A thin film capacity element composition of the present invention includes a bismuth layer-structured compound having a c-axis oriented substantially vertical with respect to a surface of a thin film formation substrate, wherein:

the bismuth layer-structured compound is expressed by a composition formula of $Ca_xSr_{(1-x)}Bi_4Ti_4O_{15}$, wherein "x" satisfies $0 \leq x \leq 1$.

A thin film capacity element according to the present invention is a thin film capacity element, wherein a lower portion electrode, a dielectric thin film and an upper portion electrode are formed successively on a substrate, wherein the dielectric thin film is composed of the thin film capacity element composition as set forth in any of the above.

Also, a thin film capacity element according to the present invention is a thin film capacity element, wherein a lower portion electrode, a dielectric thin film and an upper portion electrode are formed successively on a substrate, wherein:

the dielectric thin film is composed of a thin film capacity element composition;

the thin film capacity element composition has a bismuth layer-structured compound having a c-axis oriented substantially vertical with respect to a surface of a thin film formation substrate; and the bismuth layer-structured compound is expressed by a composition formula of $Ca_xSr_{(1-x)}Bi_4Ti_4O_{15}$, wherein "x" satisfies $0 \leq x \leq 1$.

In the present invention, an average change rate ($\Delta\epsilon$) of a permittivity against a temperature at least in a temperature range of $-55°$ C. to $+150°$ C. is preferably within $\pm 100$ ppm/° C. (reference temperature is 25° C.), more preferably within $\pm 70$ ppm/° C. (reference temperature is 25° C.), and particularly preferably within $\pm 30$ ppm/° C. (reference temperature is 25° C.).

A thin film multilayer capacitor according to the present invention is

A thin film multilayer capacity, wherein a plurality of dielectric thin films and internal electrode thin films are alternately stacked on a substrate, wherein:

the dielectric thin film is composed of the thin film capacity element composition as set forth in any one of the above.

A thin film multilayer capacitor according to another aspect of the present invention is a thin film multilayer capacitor, wherein a plurality of dielectric thin films and internal electrode thin films are alternately stacked on a substrate, wherein:

the dielectric thin film is composed of a thin film capacity element composition;

the thin film capacity element composition includes a bismuth layer-structured compound having a c-axis being substantially vertical with respect to a surface of a thin film formation substrate; and the bismuth layer-structured compound is expressed by a composition formula of $Ca_xSr_{(1-x)}Bi_4Ti_4O_{15}$, wherein "x" satisfies $0 \leq x \leq 1$.

The high-permittivity insulation film according to the present invention is composed of the thin film capacity element composition as set forth in any one of the above and including a bismuth layer-structured compound having a c-axis oriented substantially vertical with respect to a surface of a thin film formation substrate.

A high-permittivity insulation film according to another aspect of the present invention is A high-permittivity insulation film, including a bismuth layer-structured compound having a c-axis oriented substantially vertical with respect to a surface of the thin film formation substrate, wherein:

the bismuth layer-structured compound is expressed by a composition formula of $Ca_xSr_{(1-x)}Bi_4Ti_4O_{15}$, wherein "x" satisfies $0 \leq x \leq 1$.

In the present invention, preferably x in the composition formula is $0<x<1$, more preferably $0.25<x<0.75$, and particularly preferably $0.5<x<0.75$.

Note that the "thin film" mentioned in the present invention means a film of a material having a thickness of several Å to several μm or so formed by a variety of thin film forming methods and excludes a bulk (block) of a thick film having a thickness of several hundreds of μm or thicker formed by the sintering method. The thin film includes a continuous film which continuously covers a predetermined region and a discontinuous film which covers discontinuously at any intervals. The thin film may be formed at a part of or allover a substrate.

A thickness of a dielectric thin film (or high-permittivity insulation film) formed by the thin film capacity element composition according to the present invention is preferably 5 to 1000 nm. Effects of the present invention are enhanced in the case of such a thickness.

A production method of the thin film capacity element composition according to the present invention is not particularly limited, and can be produced, for example, by using a substrate oriented to the [001] direction of a cubic crystal, tetragonal crystal, rhombic crystal and monoclinic, etc. In this case, the substrate is preferably composed of a monocrystal.

In the present invention, the orientation degree of the composition may be random or c-axis orientation. Note that in the case of a thin film capacity element composition including a bismuth layer-structured compound expressed by a composition formula of $Ca_xSr_{(1-x)}Bi_4Ti_4O_{15}$, c-axis orientation is preferable.

In this case, it is particularly preferable that the c-axis of the bismuth layer-structured compound is oriented by 100% and being vertical with respect to the substrate surface, that is, the c-axis orientation degree of the bismuth layer-structured compound is 100%, but the c-axis orientation degree does not have to be always 100%.

Preferably, the c-axis orientation degree of the bismuth layer-structured compound is 80% or higher, more preferably 90% or higher, and particularly preferably 95% or higher. By improving the c-axis orientation degree, effects of the present invention is enhanced.

Preferably, in the thin film multilayer capacitor according to the present invention, the internal electrode thin film is composed of a precious metal, base metal or a conductive oxide.

In the thin film capacitor element and thin film multilayer capacitor according to the present invention, the substrate may be composed of an amorphous material. The lower portion electrode (or internal electrode thin film) formed on the substrate is preferably formed to be in the [001] direction. By forming the lower portion electrode to be in the [001] direction, the c-axis of the bismuth layer-structured compound composing a dielectric thin film formed thereon can be oriented vertically with respect to the substrate surface.

In the thin film capacity element composition according to the present invention, when a bismuth layer-structured compound having a specific composition is configured to be c-axis oriented, a thin film capacity element composition composed of a bismuth layer-structured compound having a specific composition being c-axis oriented and a thin film capacity element, such as a capacitor, etc., using the same are excellent in temperature characteristics of permittivity (an average change rate of a permittivity against a temperature at a reference temperature of 25° C. is within ±100 ppm/° C.), capable of giving a relatively high permittivity (for example, 200 or higher) and a low loss (tan δ is 0.02 or lower), and having an excellent leakage property (for example, the leakage current measured at electric field intensity of 50 kV/cm is $1\times10^{-7}$ A/cm$^2$ or lower), improved breakdown voltage (for example, 1000 kV/cm or higher) and excellent surface smoothness (for example, surface roughness Ra is 2 nm or less).

Also, the thin film capacity element composition according to the present invention is excellent in temperature characteristics of permittivity, capable of giving a relatively high permittivity even when the film is made thin, moreover, the surface smoothness is preferable, so that the number of stacked dielectric thin films of the thin film capacity element composition can be also increased. Accordingly, by using the thin film capacity element composition as above, a compact thin film multilayer capacitor as a thin film capacity element being excellent in temperature characteristics of permittivity and capable of giving a relatively high capacity can be provided.

Furthermore, the thin film element composition and thin film capacity element of the present invention are excellent in a frequency characteristic (for example, a ratio of a permittivity value in a high frequency range of 1 MHz and that in a lower frequency range of 1 kHz at a specific temperature is 0.9 to 1.1 as an absolute value) and excellent in a voltage characteristic (for example, a ratio of a permittivity value at a measurement voltage of 0.1V and that at a measurement voltage of 5V under a specific frequency is 0.9 to 1.1 as an absolute value).

The thin film capacity element is not particularly limited, and a capacitor (for example, a single layer thin film capacitor and a multilayer thin film multilayer capacitor, etc.) and a capacitor (for example, for a DRAM, etc.), etc. having a conductor-insulator-conductor structure may be mentioned.

The thin film capacity element composition is not particularly limited, and a capacitor dielectric thin film composition, etc. may be mentioned.

The high-permittivity insulation film according to the present invention is composed of a composition having the same composition as that of the thin film capacity element composition according to the present invention. The high-permittivity insulation film of the present invention may be used, for example, as a gate insulation film of a semiconductor apparatus and an intermediate insulation film between a gate electrode and a floating gate, etc. other than the thin film dielectric film of a thin film capacity element or a capacitor.

BRIEF DESCRIPTION OF DRAWINGS

Below, the present invention will be explained based on an embodiment shown in the drawings.

BEST MODE FOR CARRYING OUT THE INVENTION

First Embodiment

Figure 1:
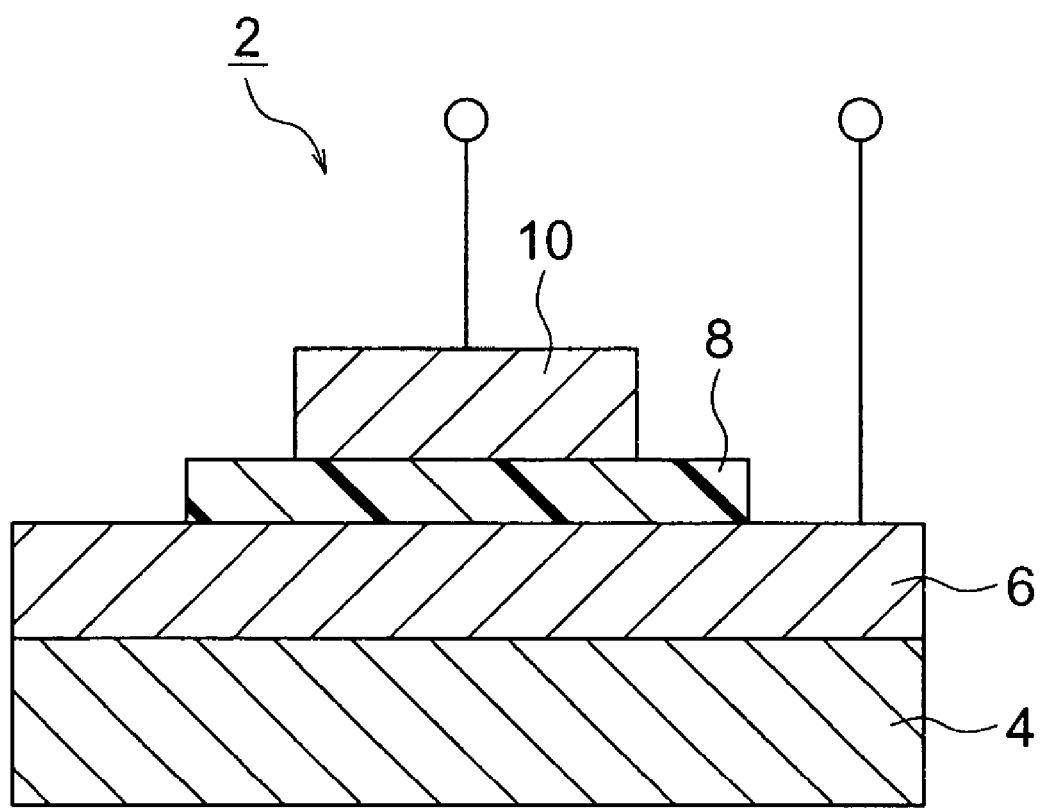
FIG. 1 is a sectional view showing an example of a thin film capacitor according to the present invention.

In the present embodiment, a thin film capacitor, wherein a dielectric thin film is formed by single layer, will be explained as an example of a thin film capacity element. As shown in FIG. 1, a thin film capacitor 2 according to an embodiment of the present invention has a thin film formation substrate 4, and a lower portion electrode thin film 6 is formed on the substrate 4. A dielectric thin film 8 is formed on the lower portion electrode thin film 6. An upper portion electrode thin film 10 is formed on the dielectric thin film B.

The substrate 4 is composed of a single crystal having good lattice matching (for example, $SrTiO_3$ single crystal, MgO single crystal and $LaAlO_3$ single crystal, etc.), an amorphous material (for example, glass, fused silica and $SiO_2/Si$, etc.) and other material (for example, $ZrO_2/Si$ and $CeO_2/Si$, etc.), etc. Particularly preferably, it is composed of a substrate oriented to the [001] direction of a cubic crystal, tetragonal crystal, rhombic crystal and monoclinic, etc. A thickness of the substrate 4 is not particularly limited and is, for example, 100 to 1000 μm or so.

In the present embodiment, a silicon monocrystal substrate is used as the substrate 4, an insulation layer 5 composed of a thermally-oxidized film (silicon oxidized film) is formed on a surface thereof, and a lower portion electrode thin film 6 is formed on the surface. A material for forming the lower portion electrode thin film 6 is not particularly limited as far as it has conductivity, and the lower portion electrode thin film 6 may be formed by using platinum (Pt), ruthenium (Ru), rhodium (Rh), palladium (Pd), iridium (Ir), gold (Au), silver (Ag), copper (Cu), nickel (Ni) and other metal, alloys containing these as a main component, and a conductive oxide having a perovskite structure, such as $SuRuO_3$, $CaRuO_3$, $SrVO_3$, $SrCrO_3$, $SrCoO_3$, $LaNiO_3$ and Nb dope $SrTiO_3$, and a mixture of these.

The lower portion electrode thin film in the case of using an amorphous material as the substrate 4 may be composed, for example, of ITO and other conductive glass.

A thickness of the lower portion electrode thin film 6 is not particularly limited, but is preferably 10 to 1000 nm, and more preferably 50 to 100 nm or so.

The upper electrode thin film 10 may be composed of the same material as that of the lower portion electrode thin film 6. A thickness thereof may be also the same.

The dielectric thin film 8 is an example of a thin film capacity element composition of the present invention and includes a first bismuth layer-structured compound having positive temperature characteristics, that a specific permittivity rises as a temperature rises, in at least a part of a predetermined temperature range; and a second bismuth layer-structured compound having negative temperature characteristics, that a specific permittivity declines as a temperature rises, in at least a part of the predetermined temperature range;

at any mixing ratio.

In the present invention, at least three forms described below can be considered as a thin film capacity element composition including the first bismuth layer-structured compound and the second bismuth layer-structured compound at any mixing ratio.

(1) A thin film capacity element composition, wherein the first bismuth layer-structured compound and the second bismuth layer-structured compound exist in a completely solid solution form, (2) a thin film capacity element composition, wherein the first bismuth layer-structured compound and the second bismuth layer-structured compound exist not in a completely solid solution form but particles thereof are mixed, and (3) a thin film capacity element composition, wherein the first bismuth layer-structured compound layer and the second bismuth layer-structured compound layer exist by being stacked to sandwich a $(Bi_2O_2)^{2+}$ layer inside the crystal structure composing the bismuth layer-structured compound, are considered.

In any of the forms, an effect of the present invention is obtained.

The first and second bismuth layer-structured compounds are expressed by a composition formula of $(Bi_2O_2)^{2+}(A_{m-1}B_mO_{3m+1})^{2-}$ or $Bi_2 A_{m-1}B_mO_{3m+3}$, wherein "m" is a positive number, "A" is at least one element selected from Na, K, Pb, Ba, Sr, Ca and Bi, and "B" is at least one element selected from Fe, Co, Cr, Ga, Ti, Nb, Ta, Sb, V, Mo, W and Mn.

Specifically, a bismuth layer-structured compound expressed by $SrBi_4Ti_4O_{15}$ or $SrBi_2Ta_2O_9$ may be mentioned as the second bismuth layer-structured compound. The present inventors found that these bismuth compounds had negative temperature characteristics that the specific permittivity declines as the temperature rises at least in a part of the predetermined temperature range. In this case, $SrBi_4Ti_4O_{15}$ has the c-axis orientation degree of preferably higher than 94%.

Also, as the first bismuth layer-structured compound, almost all bismuth layer-structured compounds except for the bismuth layer-structured compound expressed by $SrBi_4Ti_4O_{15}$ or $SrBi_2Ta_2O_9$ may be mentioned. The almost all bismuth layer-structured compounds except for the bismuth layer-structured compound expressed by $SrBi_4Ti_4O_{15}$ or $SrBi_2Ta_2O_9$ have positive temperature characteristics that the specific permittivity rises as the temperature rises at least in a part of the predetermined temperature range. As a particularly preferable first bismuth layer-structured compound, a bismuth layer-structured compound expressed by a composition formula of $SrBi_4Ti_4O_{15}$, wherein "M" is at least one of Ca, Ba and Pb, may be mentioned. The present inventors found that these bismuth layer-structured compounds have the positive temperature characteristics that the specific permittivity rises as the temperature rises at least in a part of the predetermined temperature range.

In the present invention, by forming a compound comprising the first bismuth layer-structured compound and the second bismuth layer-structured compound at a predetermined mixture ratio, temperature characteristics (a temperature coefficient) of a thin film capacity composition can be freely controlled. For example, by changing the composition ratio "x" ($0 \leq x \leq 1$) of the first bismuth layer-structured compound with respect to an entire composition including the first layer-structured compound and the second layer-structured compound, it is possible to shift the temperature coefficient from negative to positive or the other way around. Note that it is liable that the temperature coefficient becomes negative when getting close to x=0, and the temperature coefficient becomes positive when getting close to x=1.

Furthermore specifically, the thin film capacity composition in this embodiment includes a bismuth layer-structured compound expressed by a composition formula of $Ca_xSr_{(1-x)}Bi_4Ti_4O_{15}$, wherein "x" satisfies $0 \leq x \leq 1$. Generally, a bismuth layer-structured compound has a layered configuration that a layered perovskite layer, wherein perovskite lattices composed of $ABO_3$ are connected, is sandwiched by a pair of layers of Bi and O. In the present embodiment, orientation of such a bismuth layer-structured compound to the [001] direction, that is, the c-axis orientation is intensified. Namely, the dielectric thin film 8 is formed, so that the c-axis of the bismuth layer-structured compound becomes oriented vertically with respect to the substrate 4.

In the present invention, it is particularly preferable that the c-axis orientation degree of the bismuth layer-structured compound is 100%, but it does not always have to be 100%, and when preferably 80% or more, more preferably 90% or more and furthermore preferably 95% or more of the bismuth layer-structured compound is c-axis oriented, it is sufficient. For example, when making the bismuth layer-structured compound to be c-axis oriented by using a substrate 4 composed of an amorphous material, such as glass, the c-axis orientation degree of the bismuth layer-structured compound may be preferably 80% or higher. Also, when making the bismuth layer-structured compound to be c-axis oriented by using a later explained variety of thin film forming methods, the c-axis orientation degree of the bismuth layer-structured compound may be preferably 90% or higher, and more preferably 95% or higher.

The c-axis orientation degree "F" of the bismuth layer-structured compound here is obtained by the formula (1) below.

$$F(\%)=(P-P0)/(1-P0)\times 100 \qquad (1)$$

In the formula (1), P0 is X-ray diffraction intensity of a c-axis of polycrystal having a completely random orientation, that is, a ratio of a total $\Sigma I(001)$ of reflection intensity $I(001)$ from a plane (001) of polycrystal having a completely random orientation and a total $\Sigma I(hk1)$ of reflection intensity $I(hk1)$ from respective crystal surfaces (hk1) of the polycrystal, that is ($\{\Sigma I(001)/\Sigma I(hk1)\}$; and P is X-ray diffraction intensity of a c-axis of a bismuth layer-structured compound, that is, a ratio of a total $\Sigma I(001)$ of reflection intensity $I(001)$ from a plane (001) of the bismuth layer-structured compound and a total $\Sigma I(hk1)$ of reflection intensity $I(hk1)$ from respective crystal surfaces (hk1) of the bismuth layer-structured compound, that is ($\{\Sigma I(001)/\Sigma I(hk1)\}$. Here, "h", "k" and "1" are any of 0 or larger integers, respectively.

Here, because P0 is a constant, when the total $\Sigma I(001)$ of reflection intensity $I(001)$ from a plane (001) is equal to the total $\Sigma I(hk1)$ of reflection intensity $I(hk1)$ from respective crystal surfaces (hk1), that is, when P=1, the c-axis orientation degree F of an anisotropic material becomes 100%.

Note that the c-axis of the bismuth layer-structured compound means the direction of combining a pair of $(Bi_2O_2)^{2+}$ layers, that is, the [001] direction. As a result that the bismuth layer-structured compound is c-axis oriented as above, dielectric characteristics of the dielectric thin film 8 are fully brought out. Namely, temperature characteristics of permittivity become excellent and, even when a film thickness of the dielectric thin film 8 is made thin as, for example, 100 nm or thinner, a relatively high permittivity and a low loss (tan σ is low) can be given, the leakage property becomes excellent, breakdown voltage is improved and excellent surface smoothness is obtained. When the tan δ decreases, a loss Q (1/tan δ) value increases.

In the dielectric thin film 8, at least one element (rare earth element Re) selected from Sc, Y, La, Ce, Pr, Nd, Pm, Sm, Eu, Gd, Tb, Dy, Ho, Er, Tm, Yb and Lu may be furthermore included in the bismuth layer-structured compound. Also by including the rare earth element, temperature characteristics of capacitance can be controlled to a certain extent, and temperature characteristics of capacitance can be furthermore improved.

In the present invention, a thin film capacity element composition including the first layer-structured compound- and the second layer-structured compound by any composition ratio is not necessarily c-axis oriented. In that case, by including the rare earth element, temperature characteristics of capacitance can be controlled, and temperature characteristics of capacitance can be furthermore improved.

A film thickness of the dielectric thin film 8 is preferably 200 nm or thinner, and more preferably 100 nm or thinner in terms of attaining a high capacity. Note that a lower limit of the film thickness is preferably 30 nm or so in consideration of an insulation property of the film.

In the dielectric thin film 8, surface roughness (Ra), for example, based on JIS-B0601 is preferably 2 nm or less, and more preferably 1 nm or less.

In the dielectric thin film 8, permittivity at 25° C. (room temperature) and a measurement frequency of 100 kHz (AC 20 mV) is preferably higher than 150, and more preferably 200 or higher.

In the dielectric thin film 8, tan σ at 25° C. (room temperature) with a measurement frequency of 100 kHz (AC 20 mV) is preferably 0.02 or lower, and more preferably 0.01 or lower. Also, a loss Q value is preferably 50 or larger, and more preferably 100 or larger.

In the dielectric thin film 8, change (particularly, a decline) of the permittivity is a little even when a frequency under a specific temperature (for example, 25° C.) is changed to a high frequency range of, for example, 1 MHz or so. Specifically, a ratio of a permittivity value in a high frequency region of 1 MHz and that in a lower frequency range of 1 kHz at a specific temperature can be set to 0.9 to 1.1 as an absolute value. Namely, the frequency characteristic is preferable.

In the dielectric thin film 8, change of capacitance is a little even when a measurement voltage (application voltage) is changed, for example, to 5V or so under a specific frequency (for example, 10 kHz, 100 kHz and 1 MHz, etc.). Specifically, a ratio of a permittivity value at a measurement voltage of 0.1V and that at a measurement voltage of 5V under a specific frequency can be set to 0.9 to 1.1. Namely, the voltage characteristic is preferable.

The dielectric thin film 8 as above can be formed by using a variety of thin film formation methods, such as a vacuum deposition method, sputtering method, pulse laser deposition (PLD) method, metal-organic chemical vapor deposition (MOCVD) method, metal-organic decomposition method and other liquid-phase method (CSD method). Particularly when the dielectric thin film 8 has to be formed at a low temperature, a plasma CVD, optical CVD, laser CVD, optical CSD and laser CSD methods are preferably used.

In the present embodiment, the dielectric thin film 8 is formed by using a substrate, etc. oriented to a specific direction ([001] direction, etc.). In terms of reducing the production cost, it is more preferable to use a substrate 4 composed of an amorphous material. When using a dielectric thin film 8 formed as above, a bismuth layer-structured compound having a specific composition is configured to be c-axis oriented. The dielectric thin film 8 and a thin film capacitor 2 using the same are excellent in temperature characteristics of permittivity, capable of giving a relatively high permittivity and a low loss, and have an excellent leakage property, improved breakdown voltage, and excellent surface smoothness.

Also, the dielectric thin film 8 and thin film capacitor 2 as such are also excellent in frequency characteristics and voltage characteristics.

Second Embodiment

In the present embodiment, a thin film multilayer capacitor, wherein a dielectric thin film is formed to be multilayer, will be explained as an example of a thin film capacitor element.

Figure 2:
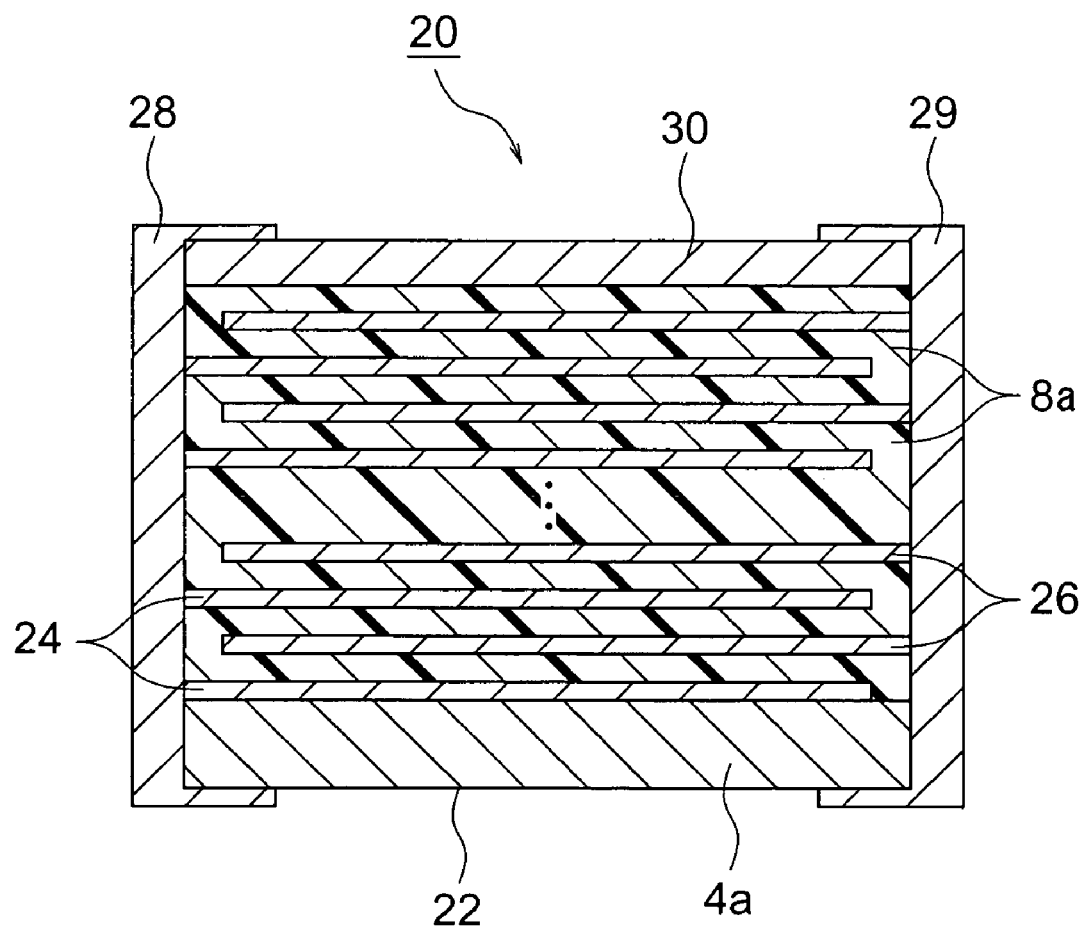
FIG. 2 is a sectional view showing an example of a thin film multilayer capacitor according to the present invention.

As shown in FIG. 2, a thin film multilayer capacitor 20 according to an embodiment of the present invention has a capacity element body 22. The capacitor element body 22 has a multilayer structure, wherein a plurality of dielectric thin films 8a and internal electrode thin films 24 and 26 are alternately arranged on a substrate 4a and a protective layer 30 is formed to cover the outermost dielectric thin film 8a. A pair of external electrodes 28 and 29 are formed at both end portions of the capacitor element body 22, and the pair of external electrodes 28 and 29 are electrically connected to exposed end surfaces of the plurality of internal electrode thin films 24 and 26 alternately arranged inside the capacitor element body 22, so that a capacitor circuit is configured. A shape of the capacitor element 22 is not particularly limited but is normally rectangular parallelepiped. Also, a size thereof is not particularly limited and., for example, a length (0.01 to 10 mm)×width (0.01 to 10 mm)×height (0.01 to 1 mm) or so.

The substrate 4a is formed by the same material as that of the substrate 4 in the first embodiment explained above. The dielectric thin film 8a is formed by the same material as that of the dielectric thin film 8 in the first embodiment explained above.

The internal electrode thin films 24 and 26 are formed by the same material as that of the lower portion electrode thin film 6 and the upper portion electrode thin film 10 in the first embodiment. A material of the external electrodes 28 and 29 is not particularly limited and composed of $CaRuO_3$, $SrRuO_3$ and other conductive oxides; Cu, a Cu alloy, Ni, a Ni alloy or other base metals:; Pt, Ag, Pd, an Ag—Pd alloy and other precious metals; etc. A thickness thereof is not particularly limited and may be, for example, 10 to 1000 nm or so. A material of the protective layer 30 is not particularly limited and it may be composed of, for example, a silicon oxide film and an aluminum oxide film, etc.

In the thin film multilayer capacitor 20, after forming a first internal electrode thin film 24 on the substrate 4a by using a mask, such as a metal mask, the dielectric thin film 8a is formed on the internal electrode thin film 24, then, a second internal electrode thin film 26 is formed on the dielectric thin film 8a. After repeating such steps for a plurality of times, an outermost dielectric thin film 8a on the opposite side of the substrate 4a is covered with the protective film 30, so that the capacitor element 22, wherein a plurality of internal electrode thin films 24 and 26 and dielectric thin films 8 are alternately arranged on the substrate 4a, is formed. By covering with the protective film 30, an effect of moisture in the air on the inside of the capacitor element 22 can be suppressed. Also, when forming the external electrodes 28 and 29 on both end portions of the capacitor element 22 by dipping or sputtering, etc., internal electrode thin films 24 as odd layers are electrically connected to one of the external electrode 28, and internal electrode thin films 26 as even layers are electrically connected to the other external electrode 29, so that the thin film multilayer capacitor 20 is obtained.

In the present embodiment, it is preferable to use a substrate 4a composed of an amorphous material in terms of reducing the production cost.

The dielectric thin film 8a used in the present embodiment is excellent in temperature characteristics of permittivity and capable of giving a relatively high permittivity even when made to be thin and, moreover, has preferable surface smoothness, so that it is possible to increase the number of stacked layers to 20 or more, and preferably 50 or more. Therefore, a compact thin film multilayer capacitor 20 having excellent temperature characteristics of permittivity and capable of giving a relatively high capacity can be provided.

In the thin film capacitor 2 and thin film multilayer capacitor 20 according to the present embodiment as explained above, it is preferable that an average change rate ($\Delta\epsilon$) of the permittivity against temperature in a range of at least −55 to +150° C. is within ±100 ppm/° C. (the reference temperature is 25° C.), more preferably within ±70 ppm/° C., and particularly preferably within ±30 ppm/° C.

Next, the present invention will be explained further in detail by taking more specific examples of the embodiment of the present invention. Note that the present invention is not limited to the examples.

EXAMPLE 1

A $SrTiO_3$ monocrystal substrate (($001)SrRuO_3$/($001$)$SrTiO_3$) obtained by performing epitaxial growing of $SrRuO_3$ to be a lower portion electrode thin film to the [001] direction was heated to be 700° C. Next, on a surface of the lower portion electrode thin film, a plurality of $Ca_xSr_{(1-x)}Bi_4Ti_4O_{15}$ thin films (dielectric thin films) having a film thickness of about 100 nm were formed by changing x to 0, 0.25, 0.5, 0.6, 0.75 and 1 by using $Ca(C_{11}H_{19}O_2)_2(C_8H_{23}N_5)_2$, $Sr(C_{11}H_{19}O_2)_2(C_8H_{23}N_5)_2$, $Bi(CH_3)_3$ and $Ti(O-i-C_3H_7)_4$ as materials by the MOCVD method. The value of x was controlled by adjusting a carrier gas flow amount of Ca material and Sr material.

When X-ray diffraction (XRD) measurement was made on a crystal structure of the dielectric thin films, it was confirmed to be oriented in the [001] direction, that is, c-axis oriented being vertical with respect to the $SrTiO_3$ monocrystal surface. Also, surface roughness (Ra) of the dielectric thin films was measured by an AFM (atomic force microscope SPI3800 made by Seiko Instruments Inc.) based on JIS-B0601.

Next, a Pt upper portion electrode thin film having 0.1 mmø was formed by a sputtering method on a surface of the dielectric thin films to produce samples of a thin film capacitor.

Electric characteristics (permittivity, tan δ, loss Q value, leakage current and breakdown voltage) and temperature characteristics of permittivity of the obtained capacitor samples were evaluated.

The permittivity (no unit) was calculated for each capacitor sample from a capacitance measured under a condition of a measurement frequency of 100 kHz (AC 20 mV) at the room temperature (25° C.) by using a digital LCR meter (4274A made by YHP), and an electrode size and distance between electrodes of the capacitor sample.

As to tan δ, measurement was made under the same condition as that of measuring the above capacitance, and a loss Q value was calculated along therewith.

The leakage current characteristic (unit: $A/cm^2$) was measured at electric field intensity of 50 kV/cm.

The temperature characteristics of permittivity were obtained for each capacitor sample by measuring a permittivity of each capacitor sample under the above condition, obtaining an average change rate ($\Delta\epsilon$) of the permittivity against a temperature in a temperature range of −55 to +150° C. when assuming that the reference temperature was 25° C., and calculating a temperature coefficient (ppm/° C.). The breakdown voltage (unit is kV/cm) was measured by raising a voltage in the leakage property measurement.

Figure 3:
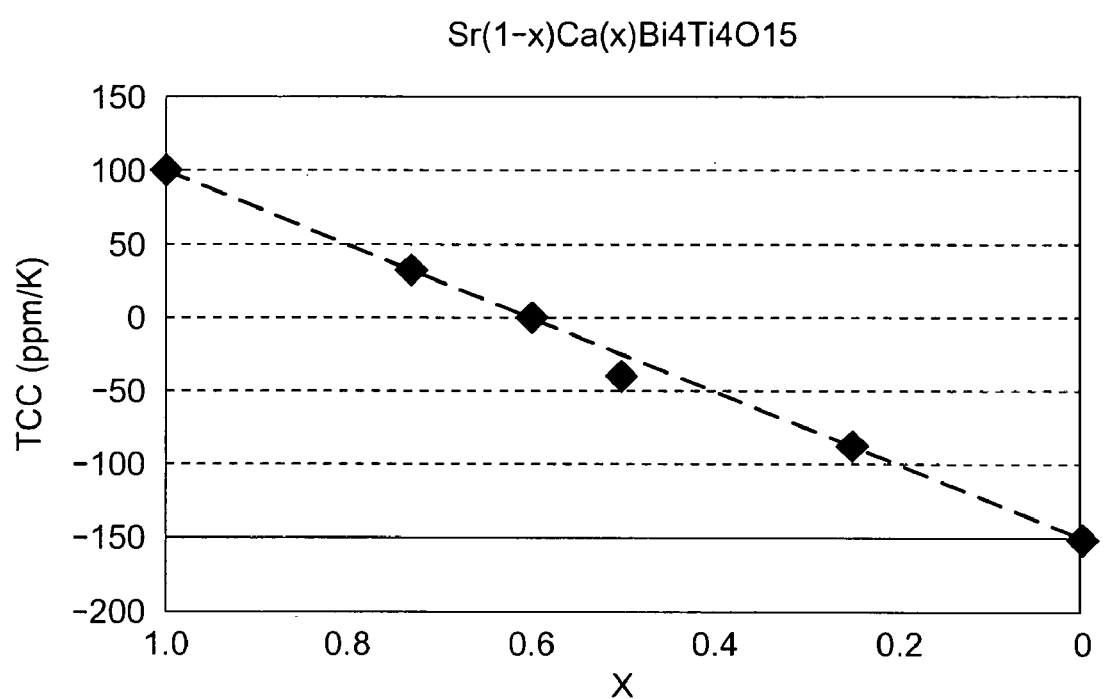
FIG. 3 is a graph showing temperature characteristics of a capacitor sample of an example.

The results are shown in Table 1 and FIG. 3.
Table 1

TABLE 1

| | x | Plane Orientation of Substrate | Orientation Direction of Film | Film Thickness (nm) | Surface Roughness (Ra(nm)) | Breakdown Voltage (kV/cm) | Leakage Current (A/cm$^2$) | Permittivity | Temperature Coefficient (ppm/° C.) | tan δ | Loss Q Value |
|---|---|---|---|---|---|---|---|---|---|---|---|
| Example 1 | 0 | [100] | [001] | 100 | <2 | >1000 | <1 × 10$^{-7}$ | 200 | −150 | <0.02 | >50 |
| Example 1 | 0.25 | [100] | [001] | 100 | <2 | >1000 | <1 × 10$^{-7}$ | 200 | −90 | <0.02 | >50 |
| Example 1 | 0.5 | [100] | [001] | 100 | <2 | >1000 | <1 × 10$^{-7}$ | 210 | −40 | <0.02 | >50 |
| Example 1 | 0.6 | [100] | [001] | 100 | <2 | >1000 | <1 × 10$^{-7}$ | 210 | 0 | <0.02 | >50 |
| Example 1 | 0.75 | [100] | [001] | 100 | <2 | >1000 | <1 × 10$^{-7}$ | 220 | 30 | <0.02 | >50 |
| Example 1 | 1 | [100] | [001] | 100 | <2 | >1000 | <1 × 10$^{-7}$ | 220 | 100 | <0.02 | >50 |

Evaluation

As shown in Table 1, it was confirmed that a c-axis oriented film of the bismuth layer-structured compound obtained in the example 1 had a high breakdown voltage of 1000 kV/cm, a low leakage current of about 1×10$^{-7}$ or so, a permittivity of 200 or higher, tan δ of 0.02 or lower, and a loss Q value was 50 or larger. Consequently, the film is expected to be furthermore thinner and, moreover, a higher capacity can be also expected as a thin film capacitor. Also, in the example 1, although the temperature coefficient was very small as ±150 ppm/° C. or smaller, the permittivity was relatively high as 200 or higher, and it was confirmed that excellent basic characteristics as a temperature compensating capacitor element were obtained. Furthermore, in the example 1, the surface smoothness was excellent, so that it was confirmed to be a suitable thin film material for producing a multilayer structure. Namely, effectiveness of the c-axis oriented film of the bismuth layer-structured compound was confirmed from the example 1.

Also, in the example 1, when a value of x is preferably 0<x<1, more preferably 0.25<x<0.75, and particularly preferably 0.5<x<0.75, it was confirmed that the temperature coefficient can be made furthermore smaller as within ±100 ppm/° C. (reference temperature is 25° C.), within ±70 ppm/° C. and within ±30 ppm/° C.

Furthermore, by changing the composition ratio x of the first bismuth layer-structured compound having a positive temperature coefficient and the second bismuth layer-structured compound having a negative temperature coefficient, it was confirmed that a temperature coefficient of the dielectric thin film (composition film) could be controlled.

EXAMPLE 2

In the present example, frequency characteristics and voltage characteristics were evaluated by using the thin film capacitor samples produced in the example 1.

Figure 4:
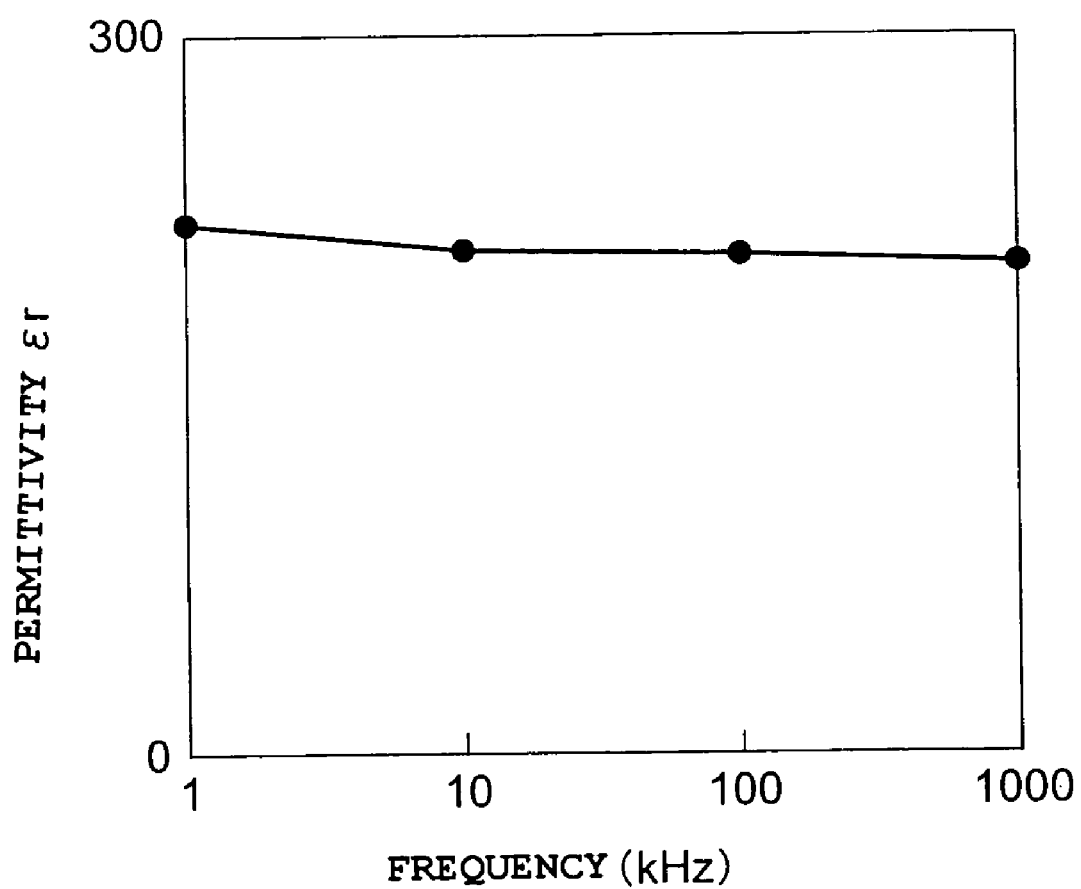
FIG. 4 is a graph showing frequency characteristics of a capacitor sample of an example.

The frequency characteristics were evaluated as below. By changing a frequency from 1 kHz to 1 MHz at the room temperature (25° C.), the capacitance was measured on each capacitor sample, and a result of calculating the permittivity was shown in FIG. 4. An LCR meter was used for measuring the capacitance. As shown in FIG. 4, it was confirmed that the permittivity value did not change even if the frequency was changed to 1 MHz under a specific temperature. Namely, the frequency characteristics were confirmed to be excellent.

Figure 5:
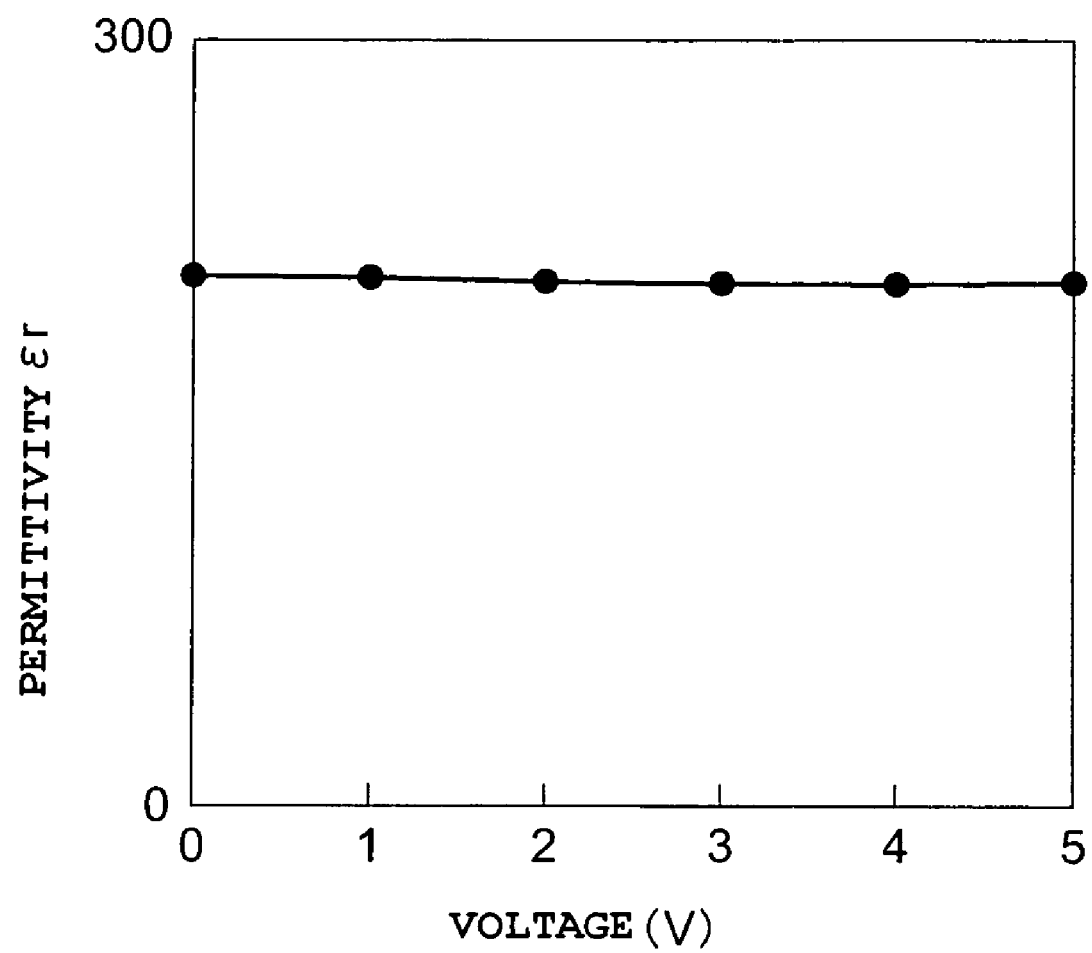
FIG. 5 is a graph showing voltage characteristics of a capacitor sample of an example.

The voltage characteristics were evaluated as below. For each capacitor sample, a measurement voltage (application voltage) was changed from 0.1V (electric field intensity of 5 kV/cm) to 5V (electric field intensity of 250 kV/cm) under a specific frequency (100 kHz), a capacitance under a specific voltage was measured (the measurement temperature was 25° C.), and a result of calculating the permittivity was shown in FIG. 5. An LCR meter was used for measuring the capacitance. As shown in FIG. 5, it was confirmed that the permittivity value did not change even if the measurement voltage was changed to 5V under a specific frequency. Namely, the voltage characteristics were confirmed to be excellent.

EXAMPLE 3

First, a SrTiO$_3$ monocrystal substrate 4a (the thickness was 0.3 mm) oriented in the [001] direction (refer to FIG. 2. It will be the same below) was prepared, a metal mask having a predetermined pattern was provided on the substrate 4a, and a electrode thin film made by SrRuO$_3$ was formed as an internal electrode thin film 24 to be a film thickness of 100 nm by a pulse laser evaporation method (pattern 1).

Next, by the pulse laser evaporation method, a Ca$_x$Sr$_{(1-x)}$Bi$_4$Ti$_4$O$_{15}$ thin film (dielectric thin film), wherein x=0.5, was formed to be a film thickness of 100 nm as a dielectric thin film 8a on allover the surface of the substrate 4a including the internal electrode thin film 24 in the same way as in the example 1.

Next, a metal mask in a predetermined pattern was provided on the dielectric thin film, and an electrode thin film made by SrRuO$_3$ was formed to be a film thickness of 100 nm as an internal electrode thin film 26 by the pulse laser evaporation method (pattern 2).

Next, by the pulse laser evaporation method, a dielectric thin film as a dielectric thin film 8a was formed to be a film thickness of 100 nm again on allover the surface of the substrate 4a including the internal electrode thin film 26 in the same way as above.

By repeating the above steps, 20 dielectric thin films were stacked. Then, a surface of the outermost dielectric thin film 8a was covered with a protective layer 30 composed of silica, so that a capacitor element body 22 was obtained.

Next, external electrodes 28 and 29 composed of Ag were formed at both end portions of the capacitor element body 22 to obtain samples of a thin film multilayer capacitor in a rectangular parallelepiped shape of a length 1 mm×width 0.5 mm×0.4 mm.

When evaluating electric characteristics (a permittivity, dielectric loss, Q value, leakage current and short-circuiting rate) of the obtained capacitor samples in the same way as in example 1, the permittivity was 210, tan δ was 0.02 or lower, a loss Q value was 50 or larger, and leakage current was 1×10$^{-7}$ A/cm$^2$ or smaller, which were preferable results.

Also, when evaluating temperature characteristics of permittivity of the capacitor samples, the temperature coefficient was −20 ppm/° C.

An embodiment and examples of the present invention were explained above, but the present invention is not limited to the embodiment and examples and may be variously modified within the scope of the present invention.

As explained above, according to the present invention, it is possible to provide a thin film capacitor element composition having excellent temperature characteristics of permittivity, capable of giving a relatively high permittivity and a low loss even when made to be thin, and having an excellent leakage property, improved breakdown voltage and excellent surface smoothness, and a thin film capacitor element using the same. Also, according to the present invention, it is also possible to provide a compact thin film multilayer capacitor with excellent temperature characteristics of permittivity and a relatively high capacity by using the thin film capacity element composition as a dielectric thin film. Furthermore, according to the present invention, it is also possible to provide a high-permittivity insulation film having excellent temperature characteristics of permittivity, capable of giving a relatively high permittivity and a low loss even when made to be thin, and having an excellent leakage property, improved breakdown voltage and excellent surface smoothness.

Also, in the present invention, by changing the mixing ratio of the first bismuth layer-structured compound having a positive temperature coefficient and the second bismuth layer-structured compound having a negative temperature coefficient, a temperature coefficient of permittivity in a dielectric thin film, etc. can be freely controlled in accordance with the use object, etc.

The invention claimed is:

1. A thin film capacity element composition, including:
a first bismuth layer-structured compound having positive temperature characteristics, that a specific permittivity rises as a temperature rises, in at least part of a temperature range; and
a second bismuth layer-structured compound having negative temperature characteristics, that a specific permittivity declines as a temperature rises, in at least a part of said temperature range;
at a ratio.

2. The thin film capacity element composition as set forth in claim 1, wherein:
said first and second bismuth layer-structured compounds are expressed by a composition formula of $(Bi_2O_2)^{2+}(A_{m-1}B_mO_{3m+1})^{2-}$ or $Bi_2A_{m-1}B_mO_{3m+3}$, wherein "in" is a positive number, "A" is at least one element selected from Na, K, Pb, Ba, Ca and Bi for the first bismuth layer-structured compound and "A" is at least one element selected from Na, K, Pb, Ba, Sr, Ca and Bi for the second bismuth layer-structured compound, and "B" is at least one element selected from Fe, Co, Cr, Ga, Ti, Nb, Ta, Sb, V, Mo, W and Mn; and
said first bismuth layer-structured compound is different from said second bismuth layer-structured compound.

3. The thin film capacity element composition as set forth in claim 1, wherein a composition formula of said second bismuth layer-structured compound is expressed by $SrBi_4Ti_4O_{15}$ or $SrBi_2Ta_2O_9$.

4. The thin film capacity element composition as set forth in claim 1, wherein said first bismuth layer-structured compound is expressed by a composition formula of $x(MBi_4Ti_4O_{15})$, said second bismuth layer-structured compound is expressed by a composition formula of $(1-x)SrBi_4Ti_4O_{15}$, "M" in the composition formula is at least one of Ca, Ba and Pb, and "x" indicating a mixing ratio of said first bismuth layer-structured compound with respect to the entire composition satisfies $0 \leq x \leq 1$.

5. The thin film capacity element composition as set forth in claim 4, wherein a compound of said second bismuth layer-structured compound is expressed by a composition formula of $Ca_xSr_{(1-x)}Bi_4Ti_4O_{15}$, wherein "x" satisfies $0 \leq x \leq 1$; and
said first bismuth layer-structured compound is different from said second bismuth layer-structured compound, wherein the first bismuth layered-structured compound does not include Sr therein.

6. The thin film capacity element composition as set forth in claim 1, furthermore including at least one element selected from Sc, Y, La, Ce, Pr, Nd, Pm, Sm, Eu, Gd, Tb, Dy, Ho, Er, Tm, Yb and Lu.

7. The thin film capacity element composition as set forth in claim 1, wherein at least one of the first and the second bismuth layer-structured compounds has a c-axis oriented.

8. The thin film capacity element composition as set forth in claim 7, wherein the c-axis orientation degree of the at least one of the first and the second bismuth layer-structured compounds is 80% or more.

9. A thin film capacity element, wherein a lower portion electrode, a dielectric thin film and an upper portion electrode are formed successively on a substrate, wherein
said dielectric thin film is composed of the thin film capacity element composition as set forth in claim 1.

10. The thin film capacity element as set forth in claim 9, wherein an average change rate (Δε) of a permittivity against a temperature at least in a temperature range of −55° C. to +150° C. is within ±100 ppm/° C.

11. The thin film capacity element as set forth in claim 10, wherein an average change rate (Δε) of a permittivity against a temperature at least in a temperature range of −55° C. to +150° C. is within ±70 ppm/° C.

12. The thin film capacity element as set forth in claim 11, wherein an average change rate (Δε) of a permittivity against a temperature at least in a temperature range of −55° C. to +150° C. is within ±30 ppm/° C.

13. A thin film multilayer capacitor, wherein a plurality of dielectric thin films and internal electrode thin films are alternately stacked on a substrate, wherein:
said dielectric thin film is composed of the thin film capacity element composition as set forth in claim 1.

14. A high-permittivity insulation film composed of the thin film capacity element composition as set forth in claim 1, formed on a thin film formation substrate and including at least one of the first and second bismuth layer-structured compounds having a c-axis oriented substantially vertical with respect to a surface of the thin film formation substrate.

15. An electronic circuit including the thin film capacity element composition as set forth in claim 1.

16. An electronic apparatus including the thin film capacity element composition as set forth in claim 1.

* * * * *